(12) United States Patent
Chu et al.

(10) Patent No.: US 11,942,167 B2
(45) Date of Patent: Mar. 26, 2024

(54) FUSE ARRAY LAYOUT PATTERN AND RELATED APPARATUSES, SYSTEMS, AND METHODS

(71) Applicant: Micron Technology, Inc., Boise, ID (US)

(72) Inventors: Wei Lu Chu, Shanghai (CN); Jing Wang, Shanghai (CN); Zhiwei Liang, Shanghai (CN); Raghu Sreeramaneni, Telangana (IN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/799,011

(22) Filed: Feb. 24, 2020

(65) Prior Publication Data

US 2021/0264997 A1     Aug. 26, 2021

(51) Int. Cl.
  *G11C 17/18*   (2006.01)
  *G11C 17/16*   (2006.01)
  *H10B 20/20*   (2023.01)

(52) U.S. Cl.
  CPC ............. *G11C 17/16* (2013.01); *G11C 17/18* (2013.01); *H10B 20/20* (2023.02)

(58) Field of Classification Search
  CPC ...................................................... G11C 17/18
  USPC ...................................................... 365/225.7
  See application file for complete search history.

(56) References Cited

U.S. PATENT DOCUMENTS

2007/0257331 A1* 11/2007 Kurjanowicz ......... H10B 20/00
                                                    257/E21.666

* cited by examiner

*Primary Examiner* — Jason Lappas
(74) *Attorney, Agent, or Firm* — TraskBritt (57) ABSTRACT

Systems, methods, and apparatuses relating to interlocking transistor active regions are disclosed. An apparatus includes a gate including electrically conductive material and an active material including a doped semiconductor material. A portion of the active material overlapped by the gate has an at least substantially triangular shape. An apparatus includes a plurality of active materials. Each active material includes tapered ends and a plurality of gates. The plurality of active materials is arranged in an interlocking pattern with at least some tapered ends of the active materials interlocking with at least some others of the tapered ends. The plurality of gates overlaps the interlocked tapered ends of the plurality of active materials.

8 Claims, 7 Drawing Sheets

FUSE ARRAY LAYOUT PATTERN AND RELATED APPARATUSES, SYSTEMS, AND METHODS

FIELD

The present disclosure relates generally to layout designs for semiconductor devices, and more specifically to layout designs for fuse circuits in memory devices.

BACKGROUND

Demand for higher and higher density semiconductor chip devices has driven scaling of features of semiconductor chip layout designs for various semiconductor devices near to or to tolerance limits of manufacturing processes. A fuse circuit is one example of a semiconductor chip device that may have a layout design that pushes process tolerance limits.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "semiconductor material" refers to a material having a conductivity between those of electrically insulating materials and electrically conductive materials. For example, a semiconductor material may have a conductivity of between about $10^{-8}$ Siemens per centimeter (S/cm) and $10^4$ S/cm at room temperature (e.g., substantially twenty degrees centigrade). Examples of semiconductor materials include element semiconductor materials found in column IV of the period table of elements such silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the period table of elements (III-V semiconductor materials) or from columns II and VI of the period table of elements (II-VI semiconductor materials), without limitation. Semiconductor devices often include crystalline semiconductor materials. By way of non-limiting examples, transistors and diodes include crystalline semiconductor materials. Accordingly, the term "semiconductor material," as used herein, refers specifically to crystalline semiconductor materials unless explicitly indicated otherwise herein.

As used herein, the term "intrinsic semiconductor material" refers to a semiconductor material having a relatively small density of impurities (e.g., a lower density of impurities than electron and hole densities resulting from thermal generation at room temperature).

As used herein, the term "doped semiconductor material" refers to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the term "active material" refers to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

As used herein, the term "at least substantially triangular" refers to a geometric shape of a feature of a semiconductor device that resembles a triangle. It will be appreciated by those of ordinary skill in the art that a triangular feature in a layout design may not result in an exactly triangular feature when implemented into a device. For example, one or more points of the triangular feature may be rounded instead of perfectly pointed, and one or more sides of the triangular feature may not be perfectly straight. Accordingly, the term "at least substantially triangular" refers to a shape of a feature of a semiconductor device that is at least "substantially" (as defined above) triangular in its layout design, but may vary from triangular in its physical form due to process effects during manufacturing of the semiconductor device.

As used herein, the term "fuse" refers to a device having a first electrical impedance in a default state and a second electrical impedance in a blown state. The first electrical impedance is different from the second electrical impedance. In some embodiments the first electrical impedance may be lower than the second electrical impedance. In some embodiments, however, a "fuse" may be implemented as an antifuse in which the first electrical impedance (default) is higher than the second electrical impedance (blown). An example of a "fuse" disclosed herein is a MOSFET capacitor (MOSCap).

Disclosed herein are fuse arrays including fuse cells having interlocking active materials. Although embodiments disclosed herein emphasize the use of interlocking active materials in fuse arrays, it will be apparent to those of ordinary skill in the art that any device array that may be arranged in an interlocking pattern in the manners disclosed herein falls within the scope of the disclosure.

A fuse cell may include a fuse (e.g., a MOSCap) and an access device (e.g., an access transistor) to access the fuse. In some embodiments active materials may include interlocking ends such as tapered ends (e.g., at least substantially triangular ends) to enable the ends of the active materials to interlock with each other. The interlocking of active materials may reduce total fuse array area occupied on a semiconductor chip by about seven percent (7%) as compared to fuse arrays that do not have interlocking active materials. Accordingly, embodiments disclosed herein may enable higher-density fuse arrays as compared to fuse arrays that do not have interlocking active materials.

Figure 1:
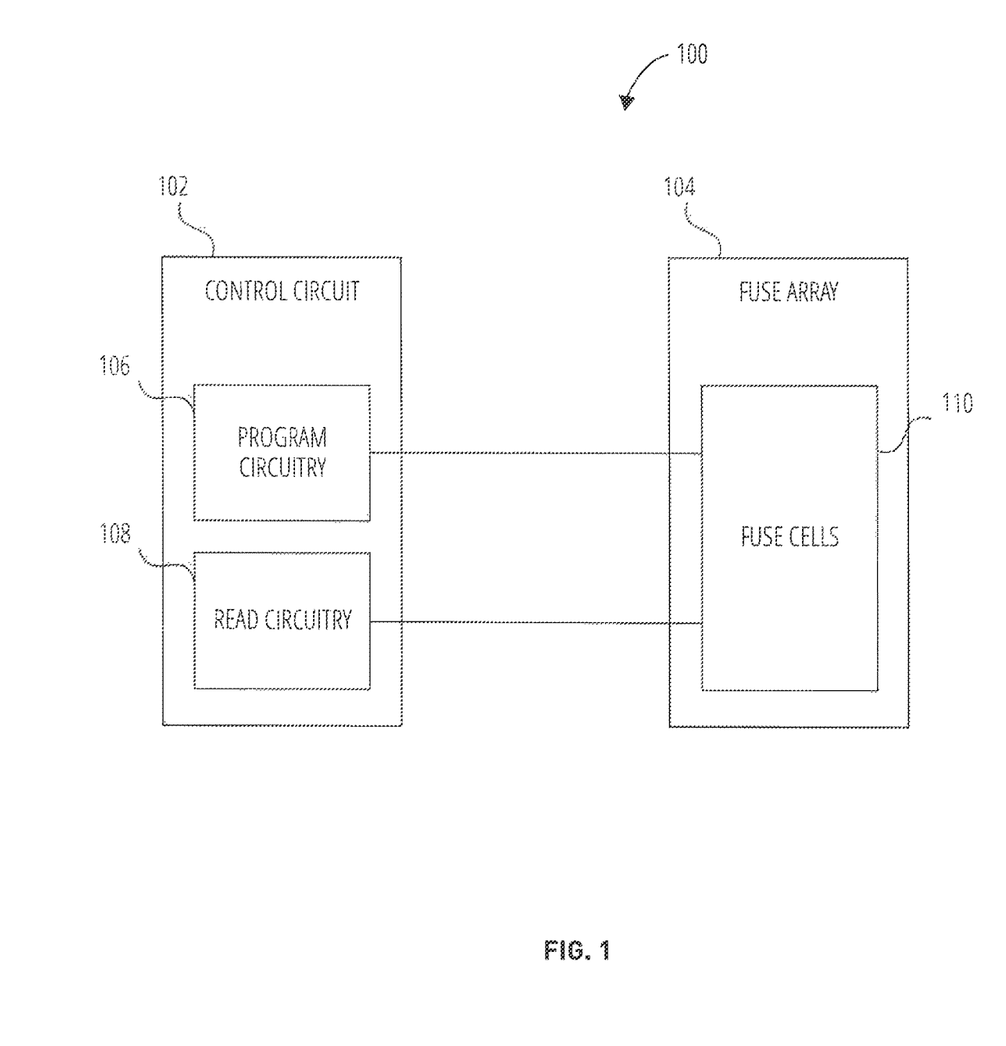
FIG. 1 is a block diagram of a fuse circuit, according to some embodiments.

FIG. 1 is a block diagram of a fuse circuit 100, according to some embodiments. The fuse circuit 100 includes a control circuit 102 and a fuse array 104. The fuse array 104 includes a plurality of fuse cells 110. The control circuit 102 includes program circuitry 106 and read circuitry 108 operably coupled to the plurality of fuse cells 110. The program circuitry 106 is configured to program the plurality of fuse cells 110. For example, the program circuitry 106 is configured to apply, to the plurality of fuse cells 110, appropriate electrical biases (e.g., bias currents and/or bias voltage potentials) to fuses in the plurality of fuse cells 110 to blow selected fuses of the plurality of fuse cells 110. Also, the read circuitry 108 is configured to read the fuses in the plurality of fuse cells 110. For example, the read circuitry 108 may be configured to apply appropriate electrical biases to enable the read circuitry 108 to measure resistances of selected fuses of the plurality of fuse cells 110. Based on the measured resistances of the fuses, the read circuitry 108 may determine whether selected fuses of the plurality of fuse cells 110 have been blown or not.

Figure 2:
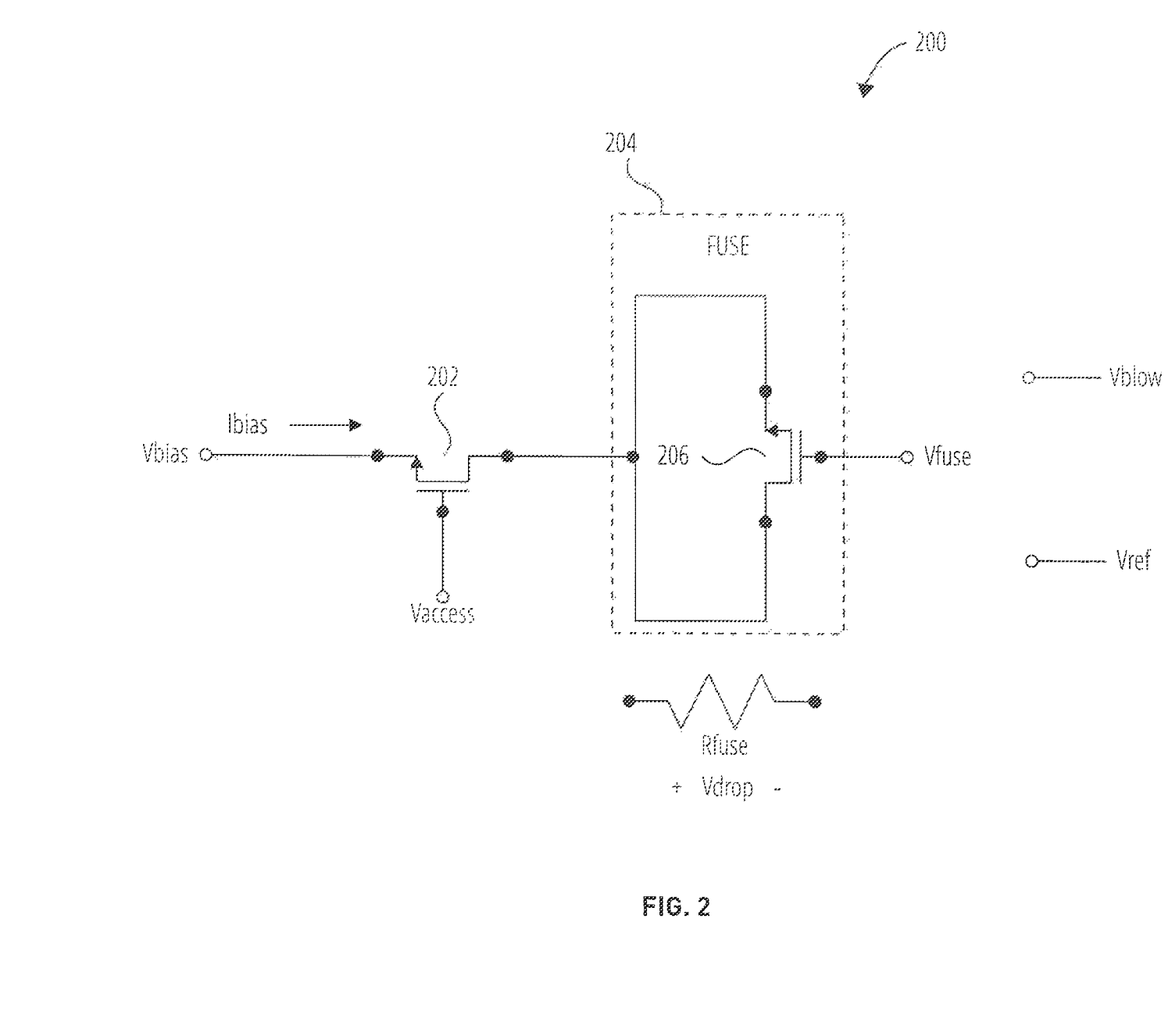
FIG. 2 is a schematic illustration of an example of a fuse cell of the plurality of fuse cells of FIG. 1, according to some embodiments.

FIG. 2 is a schematic illustration of an example of a fuse cell 200 of the plurality of fuse cells 110 of FIG. 1, according to some embodiments. The fuse cell 200 includes an access transistor 202 and a fuse 204. The fuse 204 includes a MOSCap 206 (i.e., a MOSFET transistor having its source terminal electrically connected to its drain terminal). The access transistor 202 is operably coupled to the fuse 204 to enable access to the fuse 204 responsive to assertion of an access voltage potential Vaccess at a gate of the access transistor 202.

As used herein, the term "assertion" and other forms of the root term "assert," when used herein with reference to an electrical signal, refers to driving of the electrical signal to an appropriate level to activate a device receiving the electrical signal. For example, the access transistor 202 is illustrated as an NMOS transistor, which may be "turned on" to function in a saturation mode (conducting between a source terminal and a drain terminal of the access transistor 202) responsive to Vaccess at the gate of the access transistor 202 being greater than a threshold voltage potential of the access transistor 202, relative to a voltage potential of the source terminal of the access transistor 202. Accordingly, a bias voltage potential Vbias and/or a bias current Ibias may be provided to the source/drain terminals of the MOSCap 206 of the fuse 204 responsive to an assertion of Vaccess.

A resistance Rfuse of the fuse 204 may vary depending on whether the fuse 204 has been blown or not. By default the fuse 204 may not be blown, which may correspond to a default state of the fuse 204. If the fuse 204 is blown the fuse 204 may be in a blown state of the fuse 204. In the default state a value of the electrical resistance Rfuse of the fuse 204 may be relatively high (e.g., greater than ten mega Ohms (>10 MΩ)). In the blown state the value of the electrical resistance Rfuse of the fuse 204 may be relatively low (e.g., about one hundred kilo Ohms (100 kΩ) or less). Accordingly, read circuitry (e.g., read circuitry 108 of FIG. 1) may be capable of determining whether the fuse 204 is in the default state or the blown state by applying appropriate electrical bias signals to the fuse 204.

By way of specific, non-limiting example, Vaccess may be asserted to access the fuse 204, a bias current Ibias may be provided to the fuse 204 via the access transistor 202, and a fuse gate voltage potential Vfuse may be set to a reference voltage potential Vref (e.g., zero volts (0 V, or in other words electrical ground)). If the fuse 204 is in the default state the value of the resistance Rfuse of the fuse 204 is relatively high, and a voltage potential drop Vdrop across the fuse 204 may be relatively high (i.e., because Vbias−Vfuse=Ibias*Rfuse, where*is the multiplication operator and Rfuse is relatively high). Accordingly, if the fuse 204 is in the default state Vbias may be expected to deviate a relatively large amount from Vfuse (with Vfuse set to Vref). In contrast, if the fuse 204 is in the blown state the value of the resistance Rfuse of the fuse 204 is relatively low, and the voltage potential drop Vdrop across the fuse 204 may be relatively small (i.e., because Vbias−Vfuse=Ibias*Rfuse and Rfuse is relatively low). Accordingly, if the fuse 204 is in the blown state Vbias may be expected to be relatively close to Vfuse (with Vfuse set to Vref).

Program circuitry (e.g., the program circuitry 106 of FIG. 1) may be configured to blow the fuse 204 by setting Vfuse to a relatively high fuse blow voltage potential Vblow (e.g., five to six volts (5-6 V)) relative to the source/drain terminals of the MOSCap 206. Accordingly, to blow the fuse 204 program circuitry may be configured to assert Vaccess at the gate of the access transistor 202, set Vbias to a relatively low voltage potential (e.g., electrical ground), and set Vfuse to Vblow.

Since the program circuitry is configured to selectively leave the fuse 204 to operate in the default state or blow the fuse 204 to operate in the blown state, the fuse cell 200 may be capable of storing one bit of information. Also, since the read circuitry is configured to determine which of the default state and the blown state the fuse 204 is operating in, the read circuitry is configured to read the bit of information stored by the fuse cell 200.

Referring to FIG. 1 and FIG. 2 together, since the fuse array 104 includes a plurality of fuse cells 110, each of which may be similar to the fuse cell 200 of FIG. 2, the fuse array 104 is configured to store a plurality of bits. Also, the program circuitry 106 is configured to program these bits to the plurality of fuse cells 110, and the read circuitry 108 is configured to read the bits from the plurality of fuse cells 110.

It should be noted that in FIG. 2 the access transistor 202 and the MOSCap 206 are shown as NMOS transistors. It should also be noted that the access transistor 202 and the MOSCap 206 may be replaced with PMOS transistors and the electrical biases applied thereto modified accordingly (e.g., Vaccess would assert by dropping Vaccess below the threshold voltage potential of the access transistor 202, Vblow would be a low voltage potential, etc.) without departing from the scope of the disclosure.

Figure 3:
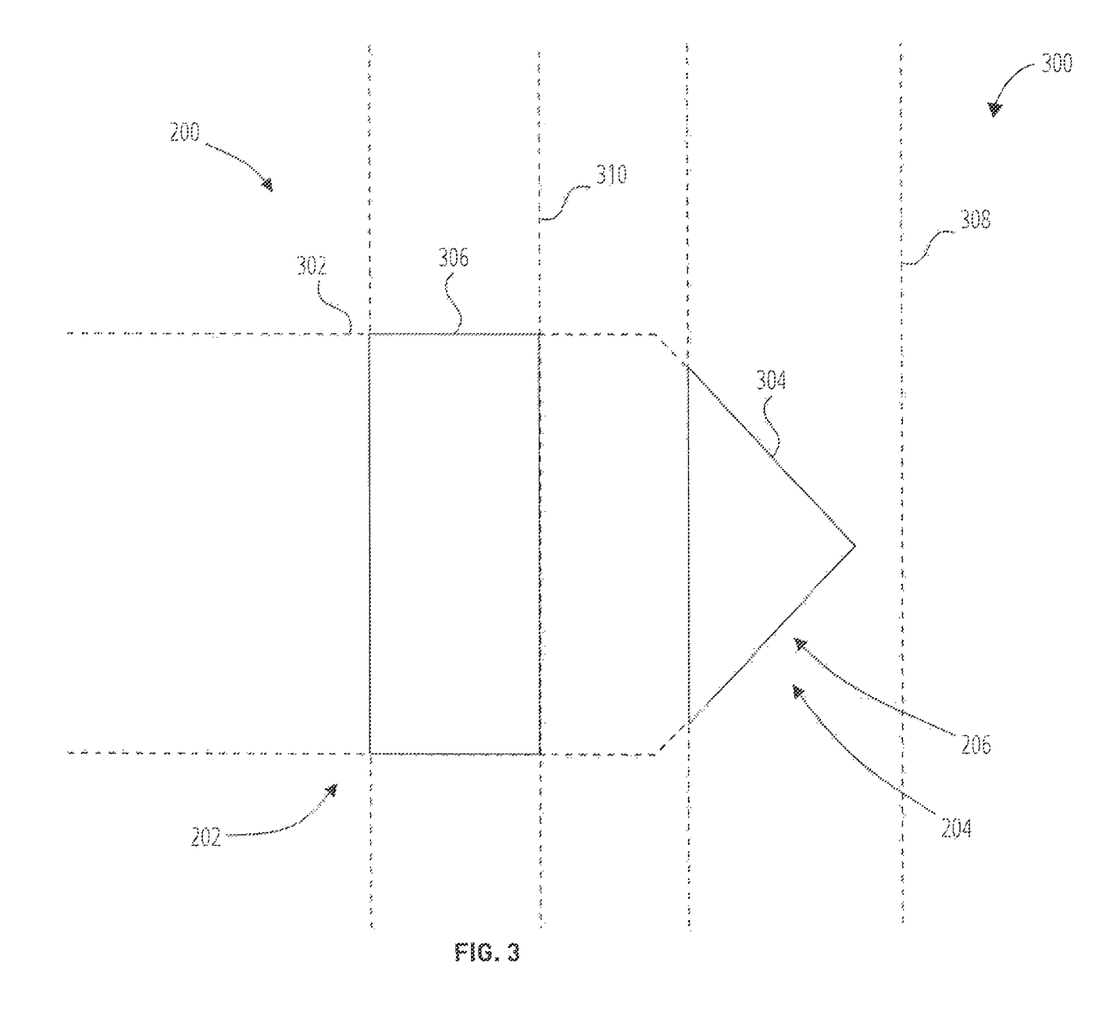
FIG. 3 is a simplified perspective view of an example of a chip layout design of the fuse cell of FIG. 2.

FIG. 3 is a simplified perspective view of an example of a chip layout design 300 of the fuse cell 200 of FIG. 2. The chip layout design 300 illustrates the fuse cell 200 including the access transistor 202 and the fuse 204. The fuse 204 includes the MOSCap 206. The chip layout design 300 also illustrates an active material 302, an access gate 310 overlapping the fuse channel region 304 and a fuse gate 308 overlapping the active material 302. The access transistor 202 includes the access gate 310 and an access channel region 306 including a portion of the active material 302 overlapped by the access gate 310. The MOSCap 206 includes the fuse gate 308 and a fuse channel region 304 including a portion of the active material 302 overlapped by the fuse gate 308. Although not shown, the access transistor 202 and the MOSCap 206 may include a gate oxide material between the active material 302 and the respective access gate 310 and fuse gate 308.

The fuse channel region 304 has, when viewed from a plan view perspective, a tapered shape to enable the fuse channel region 304 to interlock with other fuse channel regions of other fuse cells, as will be discussed in more detail below with reference to FIG. 4. By way of non-limiting example, the fuse channel region 304 may be triangular, and as a result a fuse channel region manufactured according to the chip layout design 300 of FIG. 3 may have an at least substantially triangular shape.

The active material 302 may include a doped semiconductor material. For example, assuming that the access transistor 202 and the MOSCap 206 are NMOS transistors the active material 302 may include an N-type doped semiconductor material. In contrast, assuming that the access transistor 202 and the MOSCap 206 are PMOS transistors the active material 302 may include a P-type doped semiconductor material.

The access gate 310 and the fuse gate 308 may include electrically conductive material. By way of non-limiting example, the access gate 310 and the fuse gate 308 may include a poly semiconductor material (e.g., polysilicon), a metal (e.g., copper, aluminum, silver, tungsten, gold, titanium, etc., and alloys thereof), or other electrically conductive material.

Figure 4:
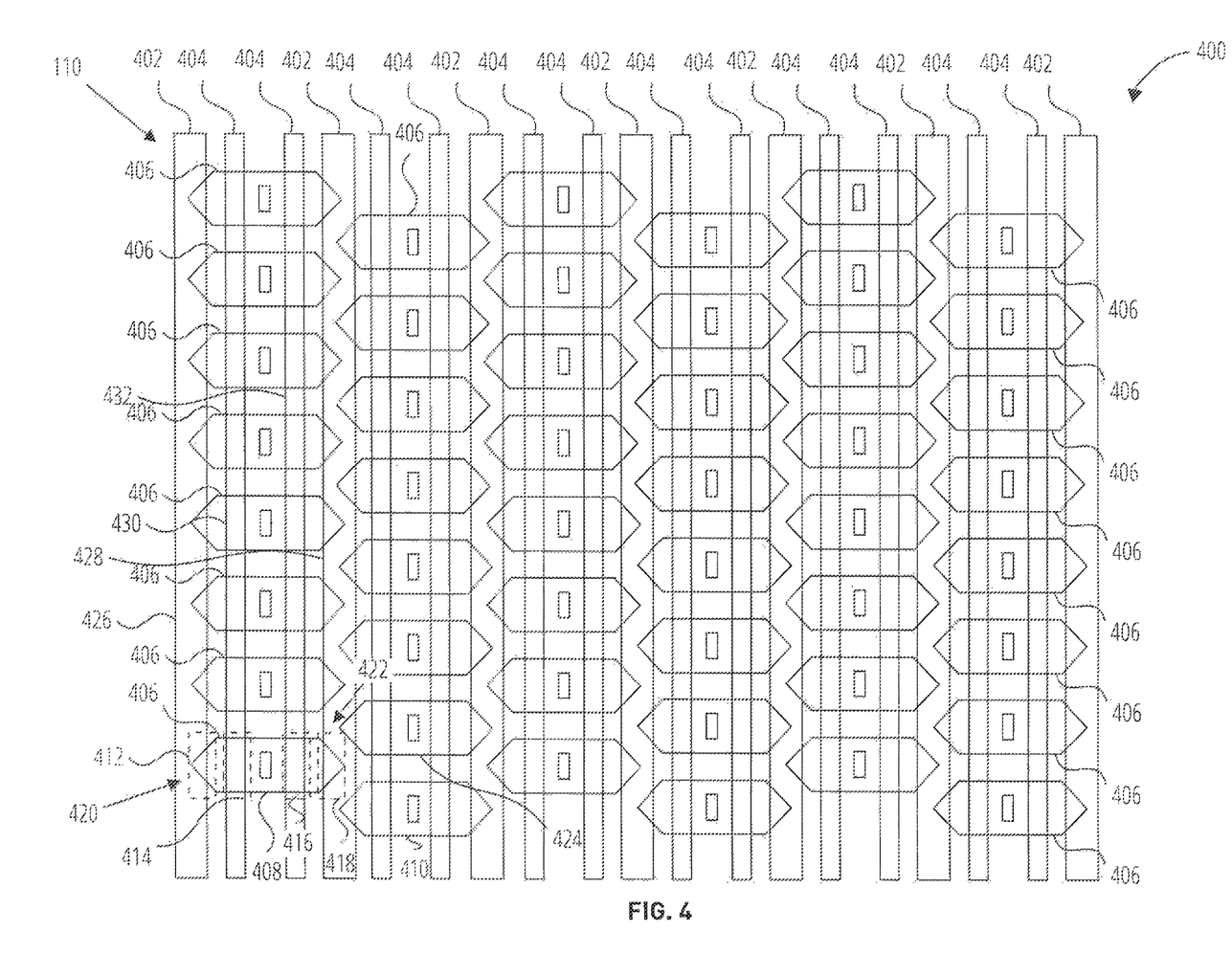
FIG. 4 is a simplified perspective view of an example of a chip layout design of a plurality of fuse cells of the fuse circuit of FIG. 1.

FIG. 4 is a simplified perspective view of an example of a chip layout design 400 of the plurality of fuse cells 110 of the fuse circuit 100 of FIG. 1. The plurality of fuse cells 110 include active materials 406 including interlocking ends. For example, each of the active materials 406 has two tapered ends (e.g., at least substantially triangularly shaped ends). The active materials 406 are arranged in an interlocking pattern with the ends of at least some of the active materials 406 interlocking with the ends of at least some others of the active materials 406. The plurality of fuse cells 110 also include fuse gates 402 overlying the interlocking ends of the active materials 406 and access gates 404 overlying the active materials 406.

Each one of the active materials 406 is part of two fuse cells. For example, a first active material 408 of the active materials 406 forms part of a first fuse cell 420 and a second fuse cell 422. The first fuse cell 420 and the second fuse cell 422 are similar to the fuse cell 200 of FIG. 2 and FIG. 3. For example, the first fuse cell 420 includes a first fuse 412 similar to the fuse 204 of FIG. 2 and FIG. 3 and a first access transistor 414 similar to the access transistor 202 of FIG. 2 and FIG. 3. The first fuse 412 includes an end of the first active material 408 overlapped by a first fuse gate 426. The first access transistor 414 includes a portion of the first active material 408 overlapped by a first access gate 430. Likewise, the second fuse cell 422 includes a second fuse 418 similar to the fuse 204 of FIG. 2 and FIG. 3 and a second access transistor 416 similar to the access transistor 202 of FIG. 2 and FIG. 3. The second fuse 418 includes an end of the first active material 408 overlapped by a second fuse gate 428. The second access transistor 416 includes a portion of the first active material 408 overlapped by a second access gate 432.

The tapered ends of the active materials 406 enable the active materials 406 to interlock with each other. For example, the tapered ends of the second active material 410 and a third active material 424 define a recess that a tapered end of the first active material 408 fits into. Distances between the active materials 406 may be at process tolerances (e.g., one hundred nanometer (100 nm) spacing between active materials 406). The spacing between gates (e.g., between adjacent fuse gates 402 and access gates 404) may also be at process tolerances (e.g., 150 nm for polysilicon). Accordingly, at tolerance spacing of interlocking active materials 406, a density of the plurality of fuse cells 110 may be about seven percent (7%) higher as compared to non-interlocking active material designs (e.g., rectangular active materials) at the same process tolerances.

In addition, as illustrated in FIG. 4 the second fuse 418 of the second fuse cell 422 shares the same one of the fuse gates 402 as the adjacent active materials 406 (second active material 410 and third active material 424) the first active material 408 interlocks with. As a result, a higher density of the plurality of fuse cells 110 is enabled as compared to designs that include separate fuse gates for adjacent active regions.

Figure 5:
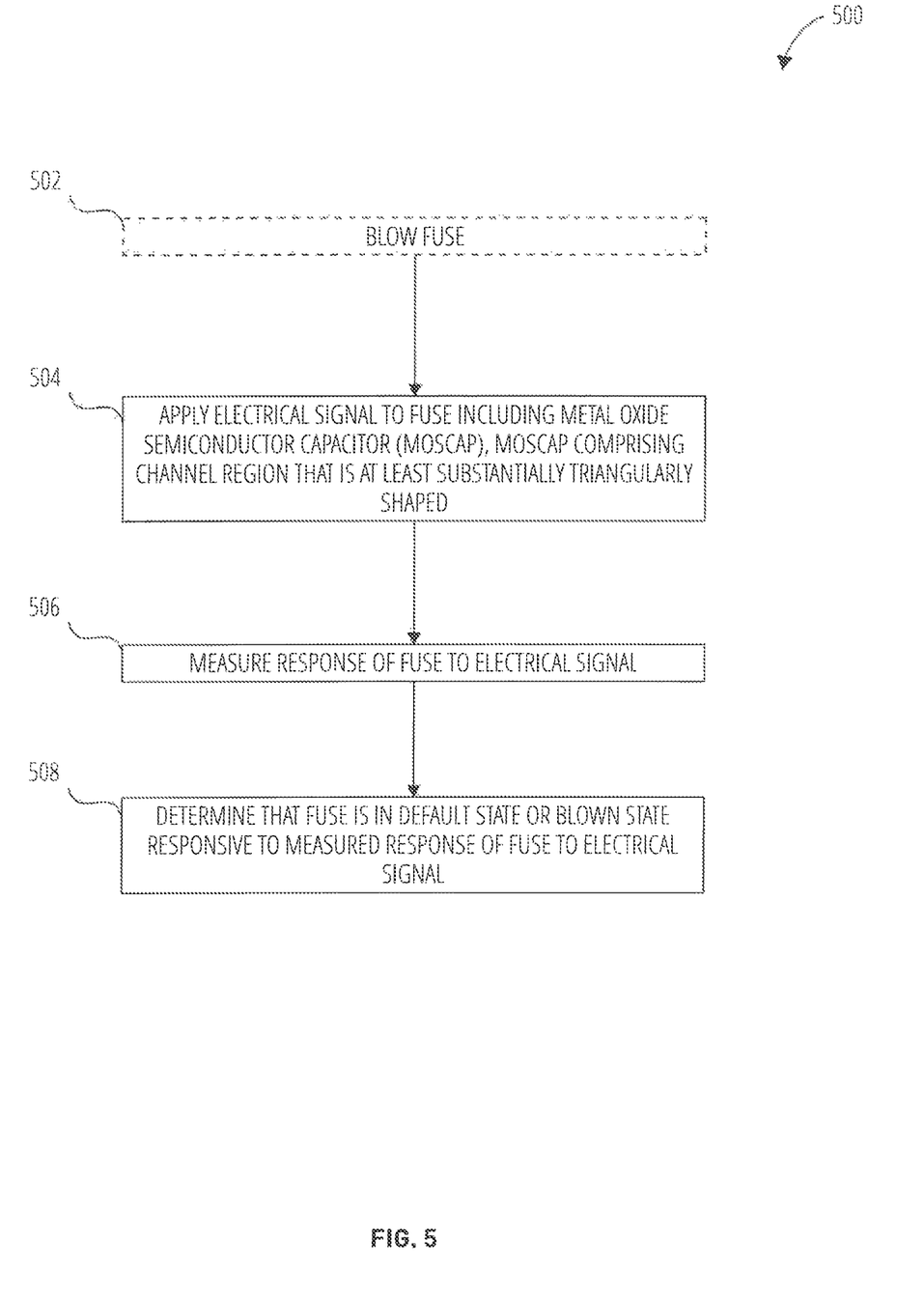
FIG. 5 is a flowchart illustrating a method of operating a fuse circuit (e.g., the fuse circuit of FIG. 1), according to some embodiments.

FIG. 5 is a flowchart illustrating a method 500 of operating a fuse circuit (e.g., the fuse circuit 100 of FIG. 1), according to some embodiments. In operation 502, method 500 optionally blows a fuse. For example, program circuitry (e.g., the program circuitry 106 of FIG. 1) may set a voltage potential of the fuse (e.g., Vfuse of FIG. 2) to a fuse blowing voltage potential (e.g., Vblow of FIG. 2) if a data bit to be written to the fuse (e.g., fuse 204 of FIG. 2) is correlated to a blown state of the fuse. If the data bit to be written to the fuse, however, is correlated to a default state of the fuse method 500 may not blow the fuse at operation 502.

In operation 504, method 500 applies an electrical signal to a fuse including a metal oxide semiconductor capacitor (MOSCap), the MOSCap comprising a channel region that is at least substantially triangularly shaped. For example, read circuitry (read circuitry 108 of FIG. 1) may set the voltage potential of the fuse (e.g., Vfuse of FIG. 2) to a reference voltage potential (Vref of FIG. 2), assert an access voltage potential (e.g., Vaccess of FIG. 2) at a gate of an access transistor (e.g., access transistor 202 of FIG. 2) configured to enable access to the fuse, and provide a bias current (e.g., Ibias of FIG. 2) to the fuse.

In operation 506, method 500 measures a response of the fuse to the electrical signal. For example, a bias voltage potential (e.g., Vbias of FIG. 2) may be measured responsive to the bias current provided to the fuse through the access transistor.

In operation 508, method 500 determines that the fuse is in a default state or a blown state responsive to the measured response of the fuse to the electrical signal. As previously discussed, an electrical resistance of the fuse (e.g., Rfuse of FIG. 2) may be relatively high if the fuse is in its default state. The resistance of the fuse may be relatively low if the fuse is in its blown state. Accordingly, the measured response (e.g., Vbias of FIG. 2) of the fuse to the bias current provided to the fuse through the access transistor may be relatively close to the reference voltage potential (e.g., Vref of FIG. 2) if the fuse is in the blown state. The measured response of the fuse to the bias current may instead be relatively far from the reference voltage potential if the fuse is in the default state.

Figure 6:
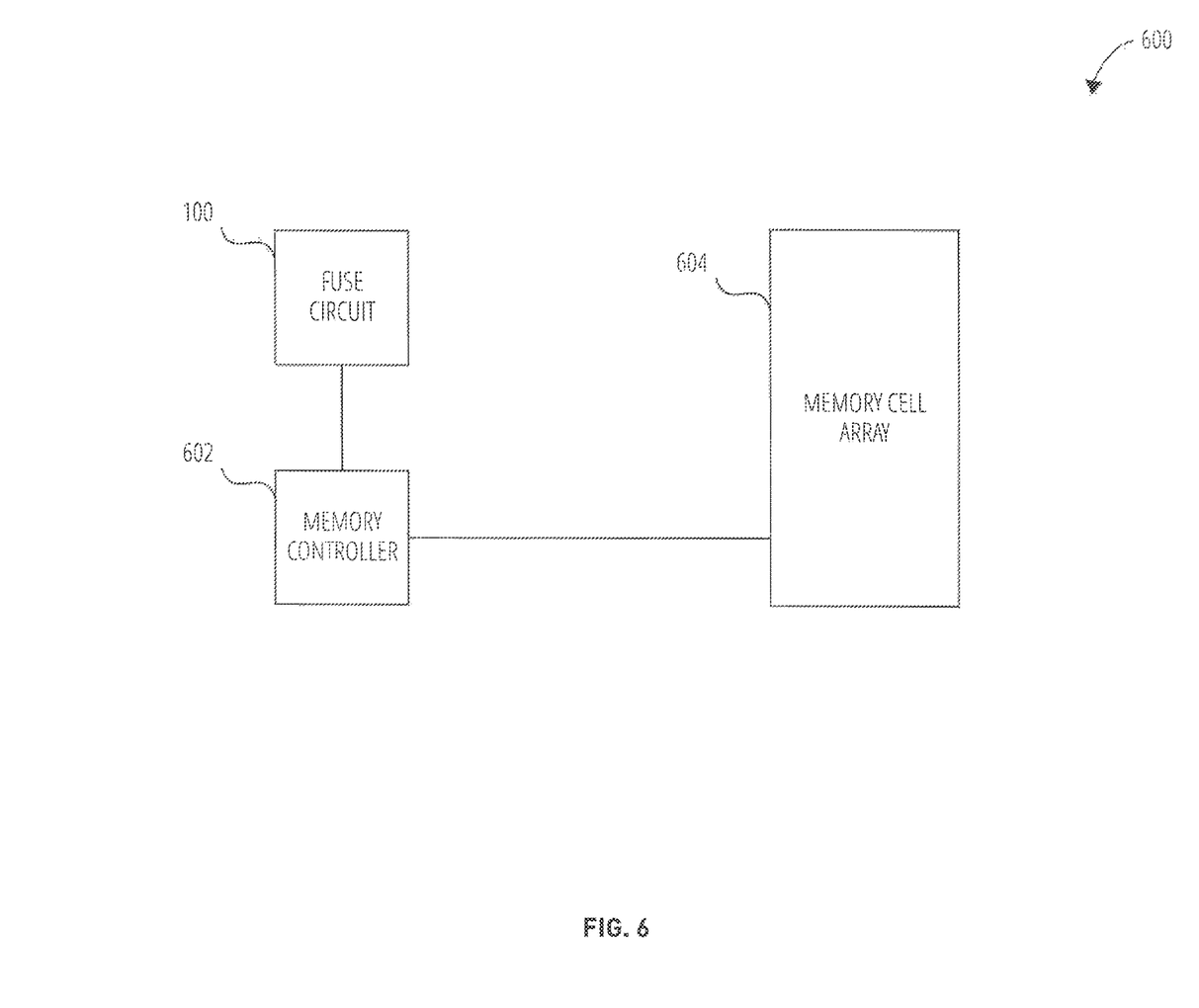
FIG. 6 is a block diagram of a memory device, according to some embodiments.

FIG. 6 is a block diagram of a memory device 600, according to some embodiments. The memory device 600 includes the fuse circuit 100 of FIG. 1, a memory controller 602, and a memory cell array 604. The memory controller 602 is operably coupled to the fuse circuit 100 and the memory cell array 604. The memory controller 602 is configured to control the fuse circuit 100 and the memory cell array 604. Since, as discussed above, the fuse circuit 100 includes active materials that have interlocking ends, a total chip area of the memory device 600 may be reduced as compared memory devices that do not implement interlocking ends of active materials.

Fuse circuits such as the fuse circuit 100 may have various uses in a memory device such as the memory device 600. The fuse circuit 100 may be used to permanently store information that is useful in operating the memory device 600. For example, the fuse circuit 100 may be used to store information indicating memory cells in the memory cell array 604 that need to have repair or maintenance performed thereon. As another example, the fuse circuit 100 may be used to store information indicating output offsets of input buffers (not shown) of the memory device 600 to enable compensation for the offsets. The fuse circuit 100 may be used for various other purposes as will be apparent to those of ordinary skill in the art.

Figure 7:
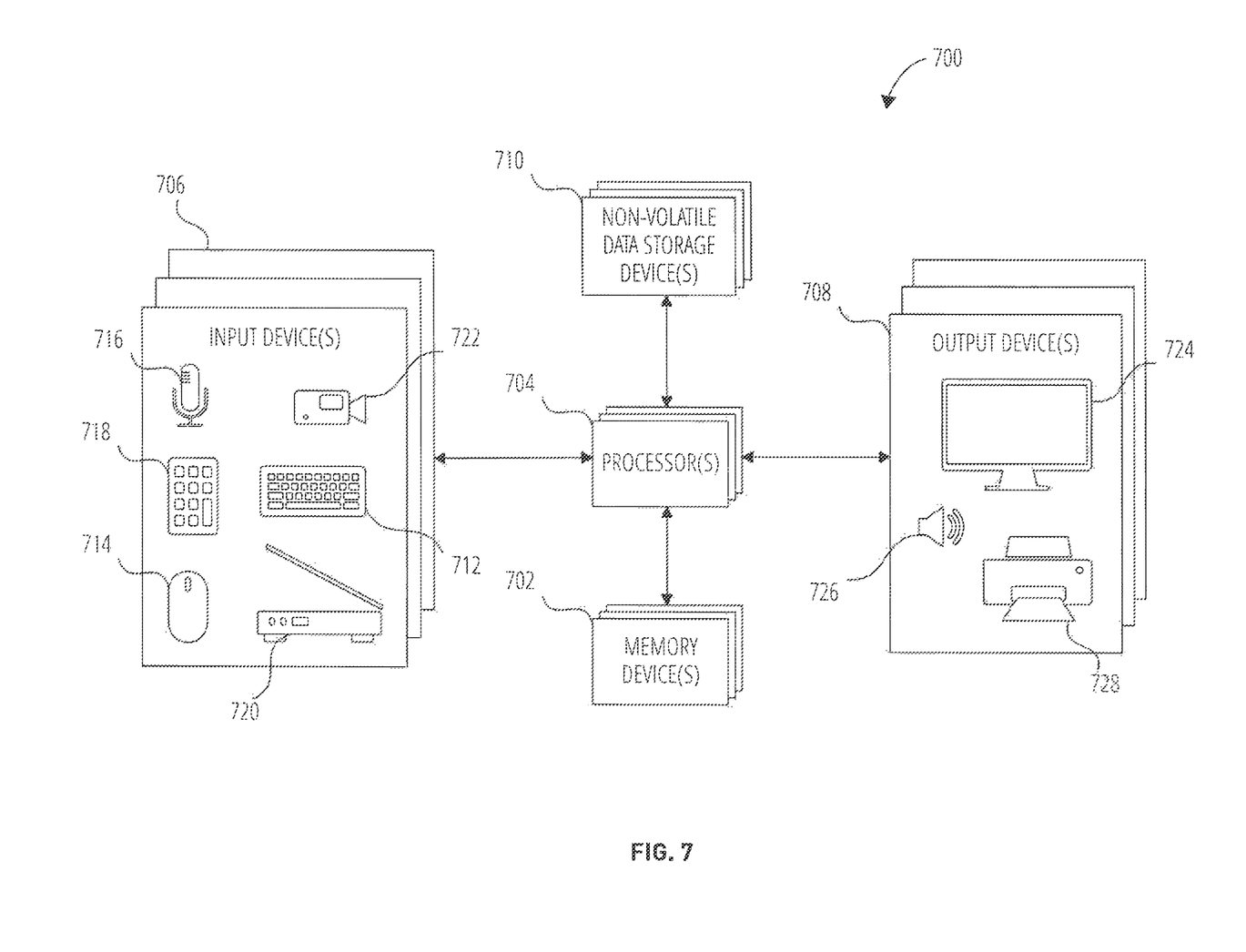
FIG. 7 is a block diagram of a computing system, according to some embodiments.

FIG. 7 is a block diagram of a computing system 700, according to some embodiments. The computing system 700 includes one or more processors (processors 704) operably coupled to one or more memory devices (memory devices 702), one or more non-volatile data storage devices (non-volatile data storage devices 710), one or more input devices (input devices 706), and one or more output devices (output devices 708). In some embodiments the computing system 700 includes a personal computer (PC) such as a desktop computer, a laptop computer, a tablet computer, a mobile computer (e.g., a smartphone, a personal digital assistant (PDA), etc.), a network server, or other computer device.

In some embodiments the processors 704 may include a central processing unit (CPU) or other processor configured to control the computing system 700. In some embodiments the memory devices 702 include random access memory (RAM), such as volatile data storage (e.g., dynamic RAM (DRAM) static RAM (SRAM), etc.). In some embodiments the non-volatile data storage devices 710 include a hard drive, a solid state drive, Flash memory, erasable programmable read only memory (EPROM), other non-volatile data storage devices, or any combination thereof. In some embodiments the input devices 706 include a keyboard 712, a pointing device 714 (e.g., a mouse, a track pad, etc.), a microphone 716, a keypad 718, a scanner 720, a camera 722, other input devices, or any combination thereof. In some embodiments the output devices 708 include an electronic display 724, a speaker 726, a printer 728, other output devices, or any combination thereof.

In some embodiments the memory devices 702 may include the memory device 600 of FIG. 1. In some embodiments, at least one of the processors 704, the memory devices 702, the non-volatile data storage devices 710, the input devices 706, and the output devices 708 includes the fuse circuit 100 of FIG. 1.

In some embodiments an apparatus comprises a gate comprising electrically conductive material. The apparatus also comprises an active material comprising a doped semiconductor material, a portion of the active material overlapped by the gate having an at least substantially triangular shape.

In some embodiments an apparatus comprises a plurality of active materials and a plurality of gates. Each active material of the plurality of active materials comprises interlocking ends. The plurality of active materials is arranged in an interlocking pattern with at least some interlocking ends of the active materials interlocking with at least some others of the interlocking ends. The plurality of gates overlap the interlocked interlocking ends of the plurality of active materials.

In some embodiments a method of operating a fuse circuit comprises applying an electrical signal to a fuse including a metal oxide semiconductor capacitor (MOSCap). The MOSCap comprises a channel region that is at least substantially triangularly shaped. The method also comprises measuring a response of the fuse to the electrical signal. The method further comprises determining that the fuse is in a default state or a blown state responsive to the measured response of the fuse to the electrical signal.

In some embodiments a computing system comprises a fuse array including a plurality of fuse cells. The plurality of fuse cells comprises a plurality of active materials, a plurality of fuse gates, and a plurality of access gates. At least some of the plurality of active materials interlock with at least some others of the plurality of active materials. The plurality of fuse gates overlaps interlocking ends of the plurality of active materials. A plurality of fuses includes the plurality of fuse gates and the interlocking ends of the plurality of active materials. The plurality of access gates overlap the plurality of active materials. A plurality of access transistors include the plurality of access gates and portions of the active materials overlapped by the access gates.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a fuse, comprising:
      a gate comprising electrically conductive material;
      an active material comprising a doped semiconductor material;
      the gate overlapping the active material to define an overlap therebetween; and
      the overlap of the active material by the gate defined by a triangular shape.

2. The apparatus of claim 1, further comprising a metal oxide semiconductor capacitor (MOSCap) comprising the gate and the active material.

3. The apparatus of claim 1, further comprising a fuse cell comprising the fuse and an access transistor, the access transistor comprising an access gate overlapping the active material, the access transistor configured to selectively provide access to the fuse.

4. The apparatus of claim 3, wherein:
   the fuse cell comprises a first fuse cell;
   the fuse comprises a first fuse;
   the gate of the fuse comprises a first gate;
   the active material of the fuse comprises a first portion of the active material;
   the first gate is overlapping the first portion of the active material to define the overlap therebetween;
   the access transistor comprises a first access transistor;
   the access gate of the access transistor comprises a first access gate; and
   the apparatus further comprises a second fuse cell including:
      a second fuse including a second gate overlapping a second portion of the active material to define an overlap therebetween; and
      a second access transistor comprising a second access gate overlapping the active material, the second access transistor configured to selectively provide access to the second fuse.

5. The apparatus of claim 4, wherein the overlap of the second portion of the active material by the second gate is defined by a triangular shape.

6. The apparatus of claim 1, wherein:
   the active material has a tapered end defining the triangular shape; and
   the gate overlaps the active material over the triangular shape of the tapered end of the active material.

7. The apparatus of claim 1, wherein:
   the active material comprises a first active material; and
   the apparatus further comprises a second active material, a portion of the second active material defining a triangular shape, the portion of the second active material interlocking with the triangular shape of the overlap of the active material by the gate.

8. The apparatus of claim 7, wherein the gate overlies the portion of the second active material.

* * * * *